(12) United States Patent
Yi et al.

(10) Patent No.: US 8,754,394 B2
(45) Date of Patent: Jun. 17, 2014

(54) VARIABLE RESISTIVE MEMORY DEVICE AND METHOD FOR FABRICATING THE SAME

(75) Inventors: Jae-Yun Yi, Gyeonggi-do (KR); Seok-Pyo Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 102 days.

(21) Appl. No.: 13/595,467

(22) Filed: Aug. 27, 2012

(65) Prior Publication Data

US 2013/0248802 A1    Sep. 26, 2013

(30) Foreign Application Priority Data

Mar. 26, 2012  (KR) .................. 10-2012-0030541

(51) Int. Cl.
 *H01L 45/00*    (2006.01)

(52) U.S. Cl.
 USPC .................. 257/4; 257/E21.656; 257/E23.01; 257/E23.011; 257/E23.141; 257/E27.098; 257/E21.004; 438/382

(58) Field of Classification Search
 None
 See application file for complete search history.

(56) References Cited

U.S. PATENT DOCUMENTS

2010/0123114 A1*    5/2010    Seko et al. .................. 257/2

* cited by examiner

*Primary Examiner* — Fei Fei Yeung Lopez
(74) *Attorney, Agent, or Firm* — IP & T Group LLP

(57) ABSTRACT

A variable resistive memory device includes a bit line, a word line, first electrodes and second electrodes, which are respectively arrayed in different directions, wherein a unit cell including a variable resistive material layer interposed between the first electrode and the second electrode is located at every intersection between the first electrode and the second electrode.

13 Claims, 6 Drawing Sheets

VARIABLE RESISTIVE MEMORY DEVICE AND METHOD FOR FABRICATING THE SAME

CROSS-REFERENCE TO RELATED APPLICATIONS

The present application claims priority of Korean Patent Application No. 10-2012-0030541, filed on Mar. 26, 2012, which is incorporated herein by reference in its entirety.

BACKGROUND

1. Field

Exemplary embodiments of the present invention relate to a resistive variable memory device and a method for fabricating the same.

2. Description of the Related Art

A variable resistive memory device stores data by using a variable resistive material which has different resistive states according to the bias applied thereto. Variable resistive memory devices include a Resistive Random Access Memory (ReRAM) device and a Phase-Change Random Access Memory (PCRAM) device.

The variable resistive memory device may have an increased degree of integration by having a so-called crossbar array structure.

A crossbar array refers to a structure including a plurality of parallel lower lines; a plurality of parallel upper lines, each crossing each of the lower lines; a variable resistive material layer interposed between the upper lines and the lower lines; and a memory cell formed at every intersection between the upper line and the lower line.

The crossbar array structure causes current leakage through an unselected memory cell, causing errors in programming and reading data of a variable resistive memory device, increasing power consumption, and so forth.

SUMMARY

An embodiment of the present invention is directed to a variable resistive memory device and a method for fabricating the variable resistive memory device, which may replace a crossbar array structure, increase integration degree, and reduce an amount of leakage current.

In accordance with an embodiment of the present invention, a variable resistive memory device includes a plurality of active regions configured to be arrayed in rows in a first direction and in zigzags in a second direction so that first landing plugs and second landing plugs are alternately disposed in a second direction; a gate pattern configured to be stretched in the second direction while dividing each active region into a first portion and a second portion by running across the active region; the first landing plugs and the second landing plugs that are formed on the first portions and the second portions, respectively; bit lines configured to be stretched in the first direction and coupled with the first landing plugs through bit line contacts; first electrode contacts and second electrode contacts that are coupled with the second landing plugs of even-numbered rows and the second landing plugs of odd-numbered rows, respectively, among rows of the active regions arrayed in the first direction; first electrodes configured to be stretched in a third direction while being coupled with the first electrode contacts and cut over the second electrode contacts; second electrodes configured to be stretched in a fourth direction crossing the third direction while being coupled with the second electrode contacts and cut over the first electrode contacts; and a variable resistive material layer configured to be interposed between the first electrodes and the second electrodes, wherein the first electrode contacts and the second electrode contacts are alternately arrayed in the third direction and the fourth direction.

In accordance with another embodiment of the present invention, a method for fabricating a variable resistive memory device includes providing a substrate where a plurality of active regions are defined, the active regions being arrayed in rows in a first direction and in zigzags in a second direction so that first landing plugs and second landing plugs are alternately disposed in a second direction; forming a gate pattern to be stretched in the second direction while dividing each active region into a first portion and a second portion by running across the active region over the substrate; forming the first landing plugs and the second landing plugs on the first portions and the second portions, respectively; forming bit lines to be stretched in the first direction and coupled with the first landing plugs through bit line contacts; forming first electrodes coupled with second landing plugs of even-numbered rows among rows of the active regions arrayed in the first direction through first electrode contacts and cut over second electrode contacts while being stretched in a third direction, second electrodes coupled with second landing plugs of odd-numbered rows among the rows of the active regions arrayed in the first direction through the second electrode contacts and cut over the first electrode contacts while being stretched in a fourth direction crossing the third direction, and a variable resistive material layer pattern interposed between the first electrodes and the second electrodes, wherein the first electrode contacts and the second electrode contacts are alternately arrayed in the third direction and the fourth direction.

DETAILED DESCRIPTION

Figure 1A:
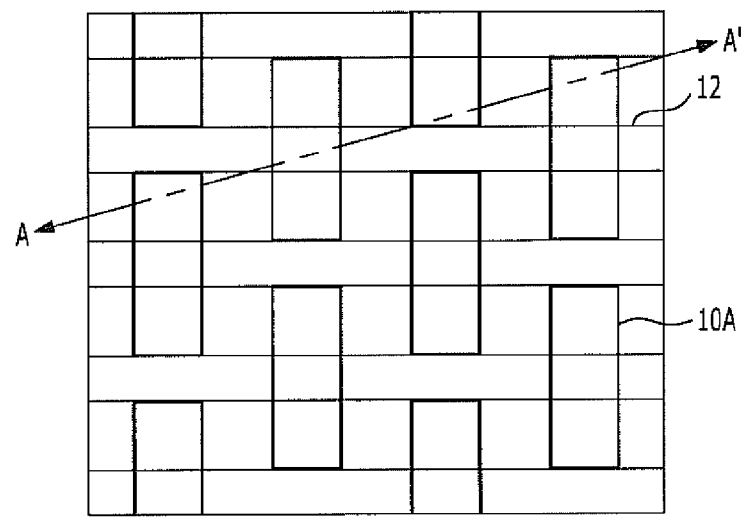
FIGS. 1A to 5B illustrate a variable resistive memory device and a method for fabricating the variable resistive memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 3A:
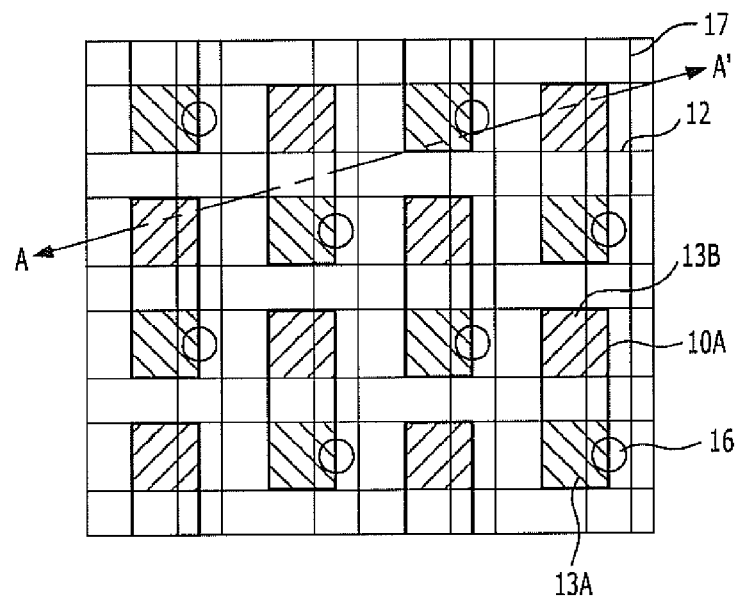
Figure 3B:
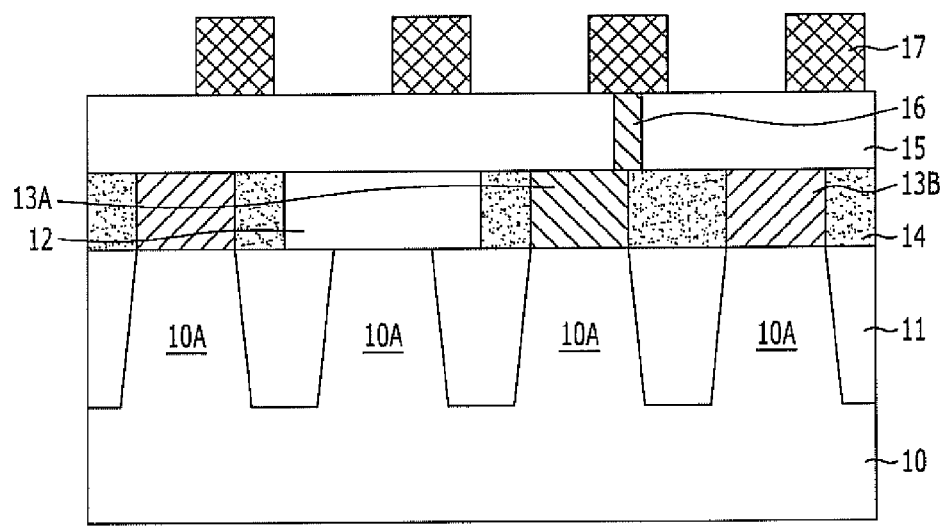
Figure 4A:
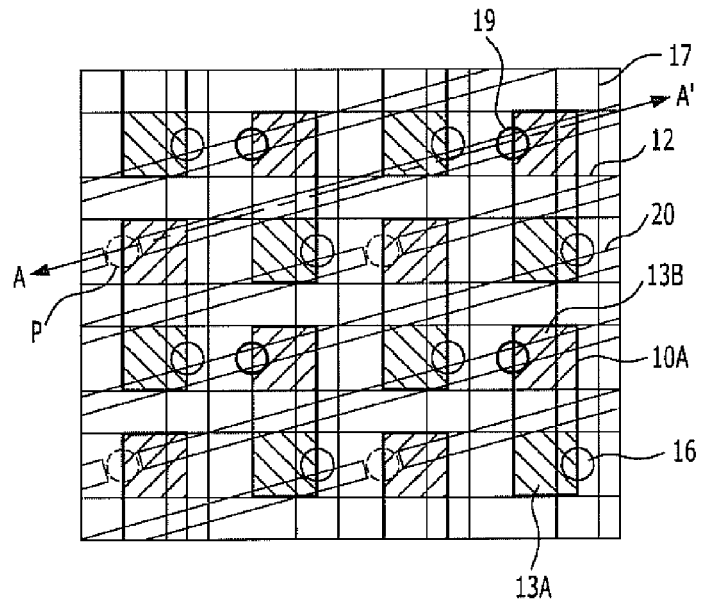
Figure 4B:
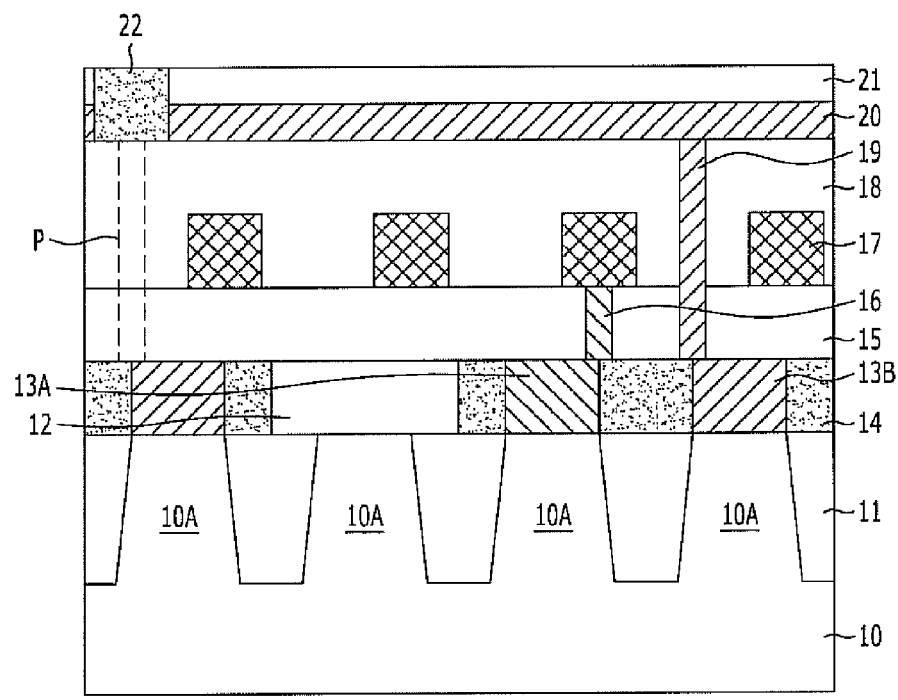
Figure 5A:
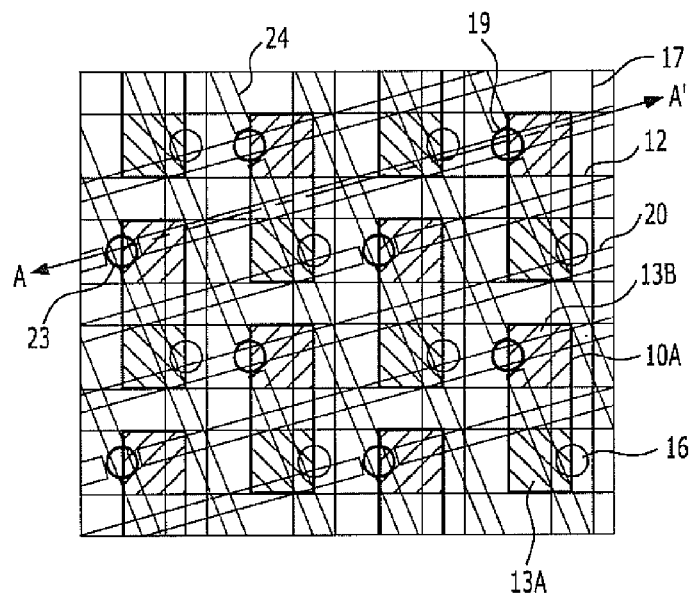
Figure 5B:
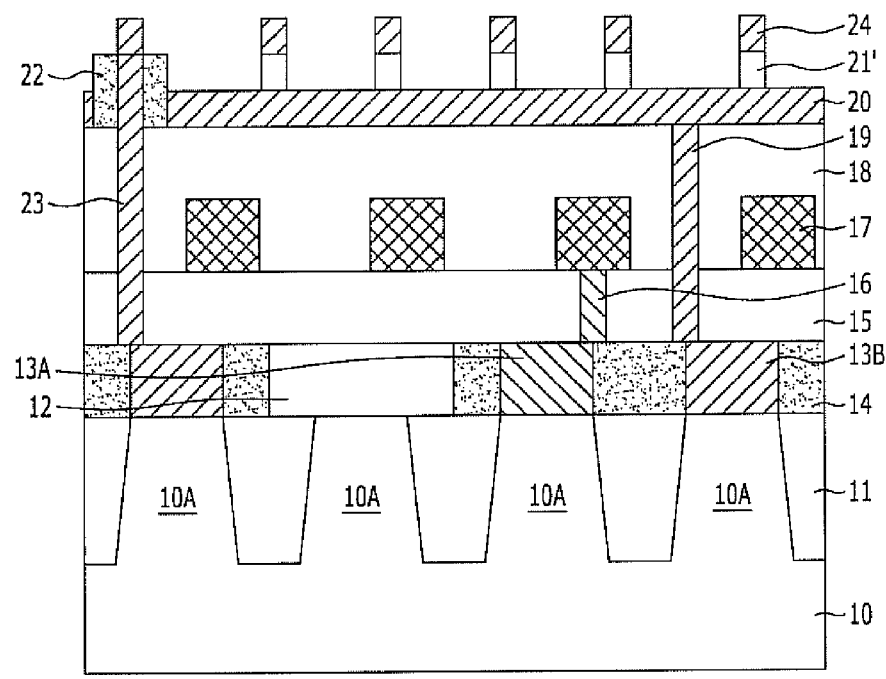

FIGS. 1A to 5B illustrate a variable resistive memory device and a method for fabricating the variable resistive memory device in accordance with an embodiment of the present invention. FIGS. 5A and 5B show the variable resistive memory device, and FIGS. 1A to 4B illustrate intermediate processes for fabricating the variable resistive memory device of FIGS. 5A and 5B. FIGS. 1A, 2A, 3A, 4A and 5A are plan views, and FIGS. 1B, 2B, 3B, 4B and 5B are cross-sectional views taken along the A-A' lines of FIGS. 1A, 2A, 3A, 4A and 5A, respectively.

Figure 1B:
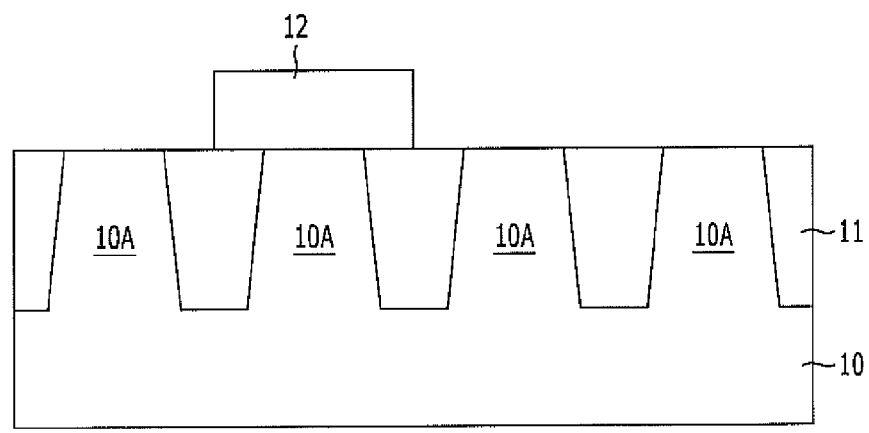

Referring to FIGS. 1A and 1B, a plurality of active regions 10A are defined by forming an isolation layer 11 over a semiconductor substrate 10. The isolation layer 11 may be formed by selectively etching isolation regions of the semiconductor substrate 10 to form trenches of a predetermined depth and filling the trenches with an insulation material.

The active regions 10A may have a shape of islands each having a long axis and a short axis. When the long axis of an active region 10A is referred to as a first direction and the short axis of an active region 10A is referred to as a second direction, the active regions 10A are arrayed in rows in the first direction and arrayed in zigzags in the second direction. The active regions 10A are arrayed in the second direction in such a manner that the portion to contact first landing plugs and the portion to contact second landing plugs are alternately disposed.

A gate pattern 12 stretched in the second direction while crossing the active regions 10A is formed over the semiconductor substrate 10. Since the active regions 10A are arrayed in zigzags in the second direction, the gate pattern 12 alternately crosses the centers of the active regions 10A and the space between two neighboring active regions 10A in the first direction. One active region 10A is divided into two portions by the gate pattern 12 crossing the center of the active region 10A. When a portion disposed on one side of the gate pattern 12 between the two portions is referred to as the portion contacting first landing plugs, a portion disposed on another side of the gate pattern 12 between the two portions is referred to as the portion contacting second landing plugs. This will be described more in detail with reference to FIGS. 2A and 2B.

Although not illustrated in the drawing, the gate pattern 12 may include a stacked structure of a gate insulation layer, a gate electrode layer and a gate hard mask. Further, the gate pattern 12 may include a gate sidewall insulation layer disposed on both sidewalls of the stacked structure.

Subsequently, source/drain regions are formed by performing an ion implantation process onto the active regions 10A on both sides of the gate pattern 12. If a drain region is formed in the active region 10A on one side of the gate pattern 12, a source region is formed in the active region 10A on the other side of the gate pattern 12.

As a result of the processes, a transistor including a source, a drain and a gate is formed for each active region 10A.

Figure 2A:
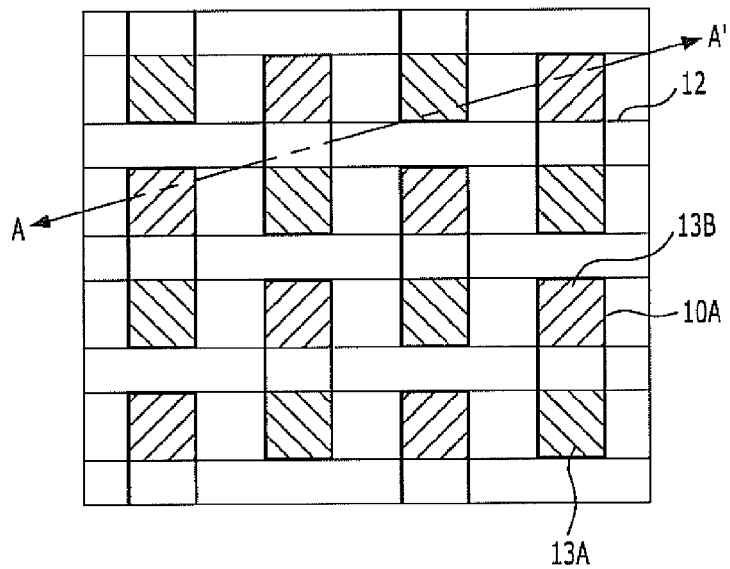
Figure 2B:
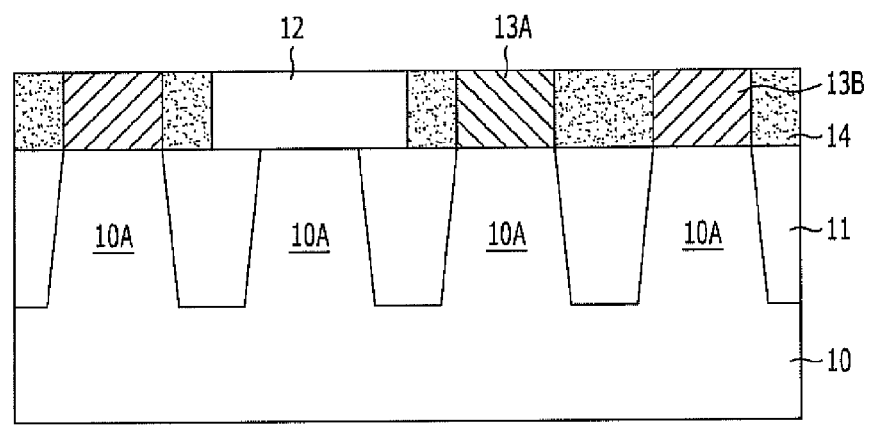

Referring to FIGS. 2A and 2B, a first landing plug 13A is formed over the active region 10A on one side of the gate pattern 12. A second landing plug 13B is formed over the active region 10A on the other side of the gate pattern 12. The spaces between the gate pattern 12 and the first and second landing plugs 13A and 13B and between the first and second landing plugs 13A and 13B may be filled with a first insulation layer 14. If a cross-sectional line were virtually set in the second direction between two neighboring pieces of the gate pattern 12, the first landing plug 13A and the second landing plug 13B could be alternately arrayed on the virtual line.

The first landing plug 13A, the second landing plug 13B and the first insulation layer 14 may be formed as follows. An insulation material is deposited to cover the profile of the substrate structure including the gate pattern 12. A first landing plug-forming hole is formed to expose the active region 10A on one side of the gate pattern 12. A second landing plug-forming hole is formed to expose the active region 10A on the other side of the gate pattern 12 by selectively etching the insulation material. The first landing plug-forming hole and the second landing plug-forming hole are filled with a conductive material. A planarization process is performed until the gate hard mask of the gate pattern 12 is exposed.

Herein, the first landing plug 13A is formed to couple one terminal of the transistor, e.g., the drain region, with a bit line which is to be described later. The second landing plug 13B is formed to couple another terminal of the transistor, e.g., transistor's source region, with a storage node which is to be described later.

Referring to FIGS. 3A and 3B, a second insulation layer 15 is formed over the substrate structure of FIGS. 2A and 2B. The second insulation layer 15 is selectively etched to form contact holes each of which exposes at least a portion of the first landing plug 13A. The contact holes are filled with a conductive material. The bit line contacts 16 are formed to couple bit lines 17 with the first landing plugs 13A by penetrating through the second insulation layer 15. One bit line contact 16 may be formed for each first landing plug 13A.

Each of the bit line contact 16 may be disposed to be inclined to one side of the first landing plug 13A, e.g., to the right of the first landing plug 13A, in the second direction while overlapping with the first landing plug 13A. Accordingly, as illustrated in the drawing, a portion of the bit line contact 16, e.g., the left half of the bit line contact 16, may overlap with the first landing plug 13A in the second direction, while the other portion, e.g., the right half of the bit line contact 16, may overlap with the isolation layer 11.

The bit lines 17 stretched coupled with the bit line contact 16 are formed in the first direction as follows. A conductive material is deposited over the second insulation layer 15 including the bit line contacts 16. The conductive material is patterned. Since each of the bit line contact 16 is disposed to be inclined to the right side of the first landing plug 13A in the second direction, each of the bit line 17 is disposed to be inclined to the right side of the first landing plug 13A in the second direction.

The bit line contact 16 and the bit line 17 are disposed to be inclined to one side, e.g., the right side, of the first landing plug 13A in the second direction to provide a space where lower electrode contacts (refer to '19' of FIGS. 4A and 4B) and upper electrode contacts (refer to '23' of FIGS. 5A and 5B) are to be formed. Controlling the extent of inclination or the width in the horizontal direction of the bit line contacts 16 and the bit lines 17 may prevent the electrical short between the lower electrode contacts/upper electrode contacts and the bit lines 17.

Referring to FIGS. 4A and 4B, a third insulation layer 18 covering the bit lines 17 is formed over the substrate structure of FIGS. 3A and 3B. Lower electrode contacts 19 coupled with the second landing plugs 13B through the third insulation layer 18 and the second insulation layer 15 are formed. In particular, when the active regions 10A arrayed in the first direction are referred to as rows of the active regions 10A, the lower electrode contacts 19 overlap and are coupled with the second landing plugs 13B located on the even-numbered rows. The second landing plugs 13B disposed on the odd-numbered rows are coupled with the upper electrode contact, which is described below. For the sake of convenience in description, the upper electrode contacts might be formed within upper electrode contact regions P.

The lower electrode contacts 19 may be formed as follows. The third insulation layer 18 and the second insulation layer 15 are selectively etched to form contact holes, each of which exposes at least a portion of each second landing plug 13B disposed on the even-numbered rows of the active regions 10A. The contact holes is filled with a conductive material. One lower electrode contact 19 may be formed for each second landing plug 13B disposed on an even-numbered row of the active regions 10A.

The lower electrode contacts 19 may be disposed to have a maximal distance from the bit line contacts 16 and the bit lines 17 in order not to be shorted from the bit line contacts 16 and the bit lines 17. Since the bit line contacts 16 and the bit lines 17 are inclined to the right sides of the first landing plugs 13A in the second direction in this embodiment of the present invention, the lower electrode contacts 19 may overlap with the second landing plugs 13B to be inclined to the left sides of the second landing plugs 13B in the second direction. Accordingly, a portion of each of the lower electrode contacts 19 in the second direction, e.g., the left halves of the lower electrode contacts 19, may overlap with the second landing plugs 13B. Other portion of each of the lower electrode contacts 19, e.g., the left halves of the lower electrode contacts 19, may overlap with the isolation layer 11.

Lower electrodes 20, which are coupled with the lower electrode contacts 19, are formed to pass over the upper electrode contact regions P. A variable resistive material layer 21, which has the same plane shape as the lower electrode 20, are formed over the lower electrode 20. A conductive material and a variable resistive material are sequentially deposited over the third insulation layer 18 including the lower electrode contacts 19. The conductive material layer and the variable resistive material layer are patterned. Herein, the third direction is against the first direction and the second direction at a predetermined angle. The lower electrode contacts 19 and the upper electrode contact regions P may be alternately arrayed in the third direction. For example, the third direction may be a direction of the A-A' line, which passes over any one lower electrode contact 19 and the upper electrode contact region P disposed on an odd-numbered row of active region, which is the second closest to the active regions row where the lower electrode contact 19 is disposed.

Subsequently, a fourth insulation layer 22 is formed to fill the space between the lower electrode 20 and the variable resistive material layer 21.

Referring to FIGS. 5A and 5B, upper electrode contacts 23 are coupled with the second landing plugs 13B by penetrating through the fourth insulation layer 22, the third insulation layer 18, and the second insulation layer 15. In particular, the upper electrode contacts 23 are coupled with some of the second landing plugs 13B, which are not coupled with the lower electrode contacts 19 but disposed on the odd-numbered rows of the active regions 10A.

The upper electrode contacts 23 may be formed as follows. The fourth insulation layer 22, the third insulation layer 18, and the second insulation layer 15 are selectively etched to form contact holes, each of which exposes at least a portion of each of the second landing plugs 13B disposed on an odd-numbered active region row. The contact holes are filled with a conductive material. One upper electrode contact 23 may be formed for each second landing plug 13B disposed on each odd-numbered active region row.

As the lower electrode contact 19 does, the upper electrode contact 23 may have a maximal distance from the bit line contact 16 and the bit line 17 in order to prevent the bit line contact 16 and the bit line 17 from the electrical short. For example, the upper electrode contact 23 may be disposed to overlap with the second landing plug 1313, particularly the left side of the second landing plug 13B in the second direction. Accordingly, a portion of the upper electrode contact 23, e.g., the right half of the upper electrode contact 23, overlaps with the second landing plug 13B in the second direction. Other portion of the upper electrode contact 23, e.g., the left half of the upper electrode contact 23, overlaps with the isolation layer 11.

Subsequently, an upper electrode 24 is coupled with the upper electrode contact 23, which is stretched in a fourth direction crossing the third direction to pass over the lower electrode contact 19. An island-shaped variable resistive material layer pattern 21' is disposed at every intersection between the upper electrode 24 and the lower electrode 20. The upper electrode 24 and the island-shaped variable resistive material layer pattern 21' are formed as follows. A conductive material is deposited over the substrate structure including the upper electrode contacts 23. The conductive material layer and the variable resistive material layer 21 are patterned. Herein, the fourth direction is against the first direction and the second direction at a predetermined angle. The lower electrode contacts 19 and the upper electrode contacts 23 are alternately arrayed in the fourth direction. For example, the fourth direction may be a direction that is substantially perpendicular to the A-A' line, which is a direction of passing over any one upper electrode contact 23. The lower electrode contact 19 is disposed on an even-numbered row of active region, which is adjacent to the row of active region where the upper electrode contact 23 is the second closest to the upper electrode contact 23.

The variable resistive memory device illustrated in FIGS. 5A and 5B may be fabricated through the above-described processes.

Referring back to FIGS. 5A and 5B, a transistor including a source, a drain and a gate as its three terminals is located in each active region 10A of the semiconductor substrate 10. The drain region of the transistor is coupled with the bit line 17 through the first landing plug 13A and the bit line contact 16. The source region of the transistor is coupled with a storage node through the second landing plug 13B, the lower electrode contact 19, and the upper electrode contact 23. The storage node includes the lower electrode 20, the upper electrode 24, and the variable resistive material layer pattern 21' interposed between the lower electrode 20 and the upper electrode 24.

Herein, the second landing plugs 13B on odd-numbered rows are coupled with the lower electrodes 20 through the lower electrode contacts 19. The second landing plugs 13B on even-numbered rows are coupled with the upper electrodes 24 through the upper electrode contacts 23.

The lower electrodes 20 pass over the upper electrode contacts 23 in the third direction. The upper electrodes 24 pass over the lower electrode contacts 19 in the fourth direction crossing the third direction. One unit cell may be formed at every intersection between the lower electrodes 20 and the upper electrodes 24.

Since the variable resistive memory device has one unit cell disposed at every intersection between the lower electrodes 20 and the upper electrodes 24, integration degree may increase. Because the lower electrodes 20 and the upper electrodes 24 are respectively formed in plural isolated shapes, not a single layer, the number of leakage current paths at unselected memory cells is greatly decreased, as compared with the conventional crossbar array structure.

Furthermore, while transistors are arrayed along the first direction and the second direction, storage nodes disposed over the transistors are arrayed in the third direction and the fourth direction, which are slanted at a predetermined angle against the first direction and the second direction. Accordingly, the integration degree may be increased even more. This is described below with reference to FIG. 6.

Figure 6:
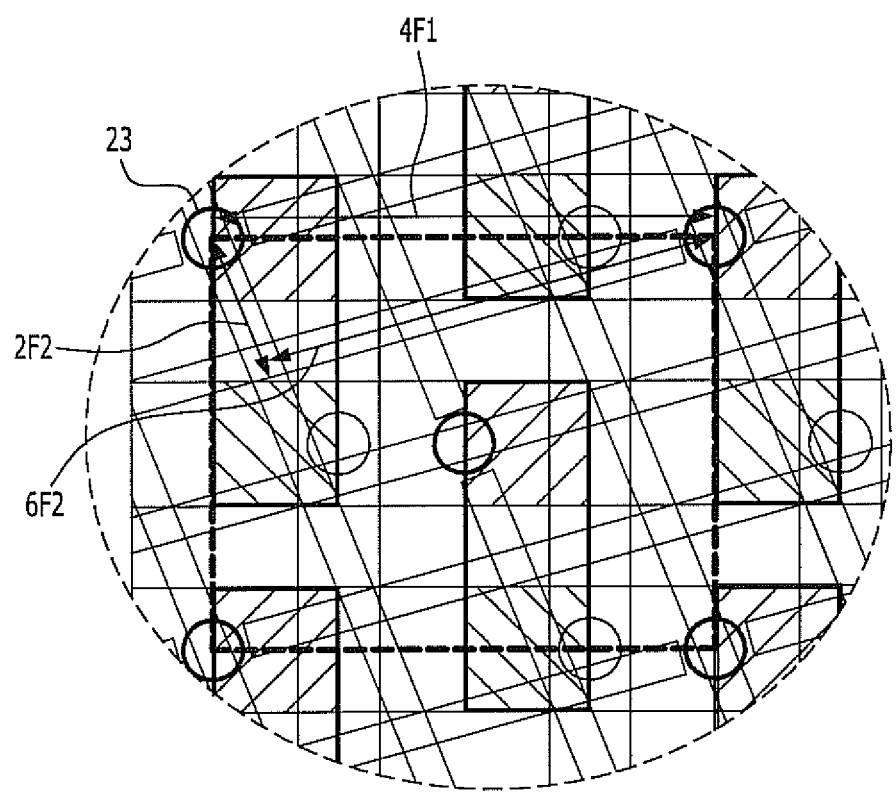
FIG. 6 shows an enlargement of a part of the variable resistive memory device shown in FIG. 5A.

FIG. 6 shows an enlargement of a part of the variable resistive memory device shown in FIG. 5A.

Referring to FIG. 6, a dotted line region has four corners, each corresponding to four upper electrode contacts 23 that are adjacent to each other in the first direction and the second direction. When a half-pitch of a transistor layer is referred to as F1, one side of the dotted line region is 4F1. Meanwhile, when a half-pitch of a storage node layer disposed over the transistor layer is referred to as F2, two sides of 2F2 and 6F2 having 4F1 as a hypotenuse may be drawn. Accordingly, an equation of $(4F1)^2=(2F2)^2+(6F2)^2$ may be satisfied.

Therefore, the area $(4F1)^2$ of the dotted line region is equal to $40(F2)^2$. As illustrated in the drawing, there are eight unit cells in the area of $40(F2)^2$.

As a result, since unit cells may be formed in the area of $5(F2)^2$, integration degree may be greatly increased.

According to an embodiment of the present invention, a variable resistive memory device may have increased integration degree with a structure that may replace a crossbar array structure and reduce leakage current.

While the present invention has been described with respect to the specific embodiments, it will be apparent to those skilled in the art that various changes and modifications may be made without departing from the spirit and scope of the invention as defined in the following claims.

What is claimed is:

1. A variable resistive memory device, comprising:
   a plurality of active regions configured to be arrayed in rows in a first direction and in zigzags in a second direction so that first landing plugs and second landing plugs are alternately disposed in a second direction;
   a gate pattern configured to be stretched in the second direction while dividing each active region into a first portion and a second portion by running across the active region;
   the first landing plugs and the second landing plugs that are formed on the first portions and the second portions, respectively;
   bit lines configured to be stretched in the first direction and coupled with the first landing plugs through bit line contacts;
   first electrode contacts and second electrode contacts that are coupled with the second landing plugs of even-numbered rows and the second landing plugs of odd-numbered rows, respectively, among rows of the active regions arrayed in the first direction;
   first electrodes configured to be stretched in a third direction while being coupled with the first electrode contacts and cut over the second electrode contacts;
   second electrodes configured to be stretched in a fourth direction crossing the third direction while being coupled with the second electrode contacts and cut over the first electrode contacts; and
   a variable resistive material layer configured to be interposed between the first electrodes and the second electrodes,
   wherein the first electrode contacts and the second electrode contacts are alternately arrayed in the third direction and the fourth direction.

2. The variable resistive memory device of claim 1, wherein each of the active regions has a long axis of the first direction and a short axis of the second direction.

3. The variable resistive memory device of claim 1, wherein each of the bit line contacts is disposed to be inclined to one side of each first landing plug in the second direction while at least a portion of the bit line contact overlaps with the first landing plug, and
   each of the first electrode contacts and the second electrode contacts is disposed to be inclined to another side of each second landing plug in the second direction while at least a portion of each of the first electrode contacts and the second electrode contacts overlaps with the second landing plug.

4. The variable resistive memory device of claim 3, wherein a portion of another side of each bit line contact overlaps with the first landing plug, while the other portion overlaps with an isolation layer, and
   a portion of one side of each of the first electrode contacts and the second electrode contacts overlaps with the second landing plug, while the other portion overlaps with the isolation layer.

5. The variable resistive memory device of claim 1, wherein each of the first electrode contacts and the second electrode contacts is disposed in a position not overlapping with the bit line contacts and the bit lines.

6. The variable resistive memory device of claim 1, wherein the third direction is a direction of a line connecting one first electrode contact and one second electrode contact that is second closest to the first electrode contact, and
   the fourth direction is a direction of a line connecting one second electrode contact and one first electrode contact that is second closest to the second electrode contact.

7. The variable resistive memory device of claim 6, wherein each of memory cells is formed in an area of $5F^2$.

8. A method for fabricating a variable resistive memory device, comprising:
   providing a substrate where a plurality of active regions are defined, the active regions being arrayed in rows in a first direction and in zigzags in a second direction so that first landing plugs and second landing plugs are alternately disposed in a second direction;
   forming a gate pattern to be stretched in the second direction while dividing each active region into a first portion and a second portion by running across the active region over the substrate;
   forming the first landing plugs and the second landing plugs on the first portions and the second portions, respectively;
   forming bit lines to be stretched in the first direction and coupled with the first landing plugs through bit line contacts;
   forming first electrodes coupled with second landing plugs of even-numbered rows among rows of the active regions arrayed in the first direction through first electrode contacts and cut over second electrode contacts while being stretched in a third direction, second electrodes coupled with second landing plugs of odd-numbered rows among the rows of the active regions arrayed in the first direction through the second electrode contacts and cut over the first electrode contacts while being stretched in a fourth direction crossing the third direction, and a variable resistive material layer pattern interposed between the first electrodes and the second electrodes,
   wherein the first electrode contacts and the second electrode contacts are alternately arrayed in the third direction and the fourth direction.

9. The method of claim 8, wherein each of the bit line contacts is disposed to be inclined to one side of each first landing plug in the second direction while at least a portion of the bit line contact overlaps with the first landing plug, and
   each of the first electrode contacts and the second electrode contacts is disposed to be inclined to another side of each second landing plug in the second direction while at least a portion of each of the first electrode contacts and the second electrode contacts overlaps with the second landing plug.

10. The method of claim 9, wherein a portion of another side of each bit line contact overlaps with the first landing plug, while the other portion overlaps with an isolation layer, and a portion of one side of each of the first electrode contacts and the second electrode contacts overlaps with the second landing plug, while the other portion overlaps with the isolation layer.

11. The method of claim 8, wherein each of the first electrode contacts and the second electrode contacts is disposed in a position not overlapping with the bit line contacts and the bit lines.

12. The method of claim 8, wherein the third direction is a direction of a line connecting one first electrode contact and one second electrode contact that is second closest to the first electrode contact, and the fourth direction is a direction of a line connecting one second electrode contact and one first electrode contact that is second closest to the second electrode contact.

13. The method of claim 8, wherein the forming of the first electrodes, the second electrodes, and the variable resistive material layer pattern comprises:

forming the first electrodes and a variable resistive material layer having the same plane shape as the first electrodes by depositing a first conductive material and a variable resistive material over a substrate structure including the first electrode contacts and patterning the first conductive material and the variable resistive material; and forming the second electrodes and the variable resistive material layer pattern by depositing a second conductive material over a substrate structure including the variable resistive material layer and patterning the second conductive material and the variable resistive material layer.

* * * * *